United States Patent [19]

Linder

[11] 3,958,243

[45] May 18, 1976

[54] CIRCUIT FOR GENERATING A DIGITAL OR ANALOG SIGNAL AS A FUNCTION OF DOPPLER FREQUENCY

[75] Inventor: John L. Linder, Las Cruces, N. Mex.

[73] Assignee: The United States of America as represented by the Secretary of the Navy, Washington, D.C.

[22] Filed: Mar. 20, 1975

[21] Appl. No.: 560,060

Related U.S. Application Data

[62] Division of Ser. No. 436,415, Jan. 25, 1974, Pat. No. 3,893,115.

[52] U.S. Cl. .................................................. 343/8
[51] Int. Cl.² ............................................ G01S 9/44
[58] Field of Search ........................... 343/8, 9, 5 DP

[56] References Cited
UNITED STATES PATENTS

| | | | |
|---|---|---|---|
| 3,689,921 | 9/1972 | Berry | 343/8 |
| 3,716,859 | 2/1973 | Webb et al. | 343/8 |
| 3,810,176 | 5/1974 | Gray | 343/8 |
| 3,836,965 | 9/1974 | Preti | 343/8 |

*Primary Examiner*—Maynard R. Wilbur
*Assistant Examiner*—G. E. Montone
*Attorney, Agent, or Firm*—Richard S. Sciascia; Joseph M. St. Amand; Darrell E. Hollis

[57] ABSTRACT

A control circuit having a digital memory for providing sweep voltages to receivers in a doppler satellite tracking station of proper amplitude and duration to ensure searching in the correct doppler frequency range. An internally generated ramp function voltage is combined with a reference voltage to produce a composite sweep signal for the receiver. The reference voltage level is determined either from a set of digi-switches or from a digital memory circuit which outputs a digital signal that is a function of the frequency of a received doppler signal.

6 Claims, 8 Drawing Figures

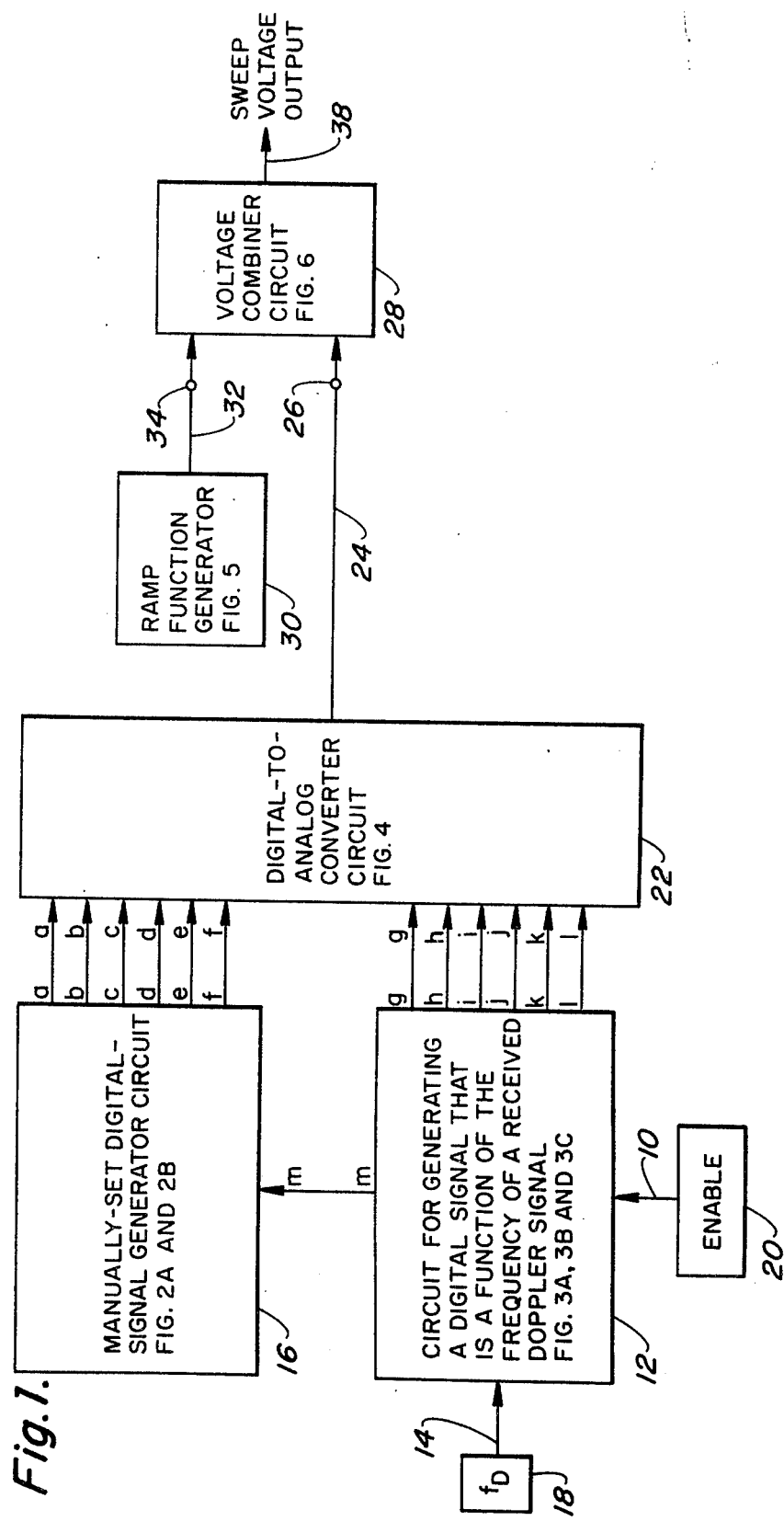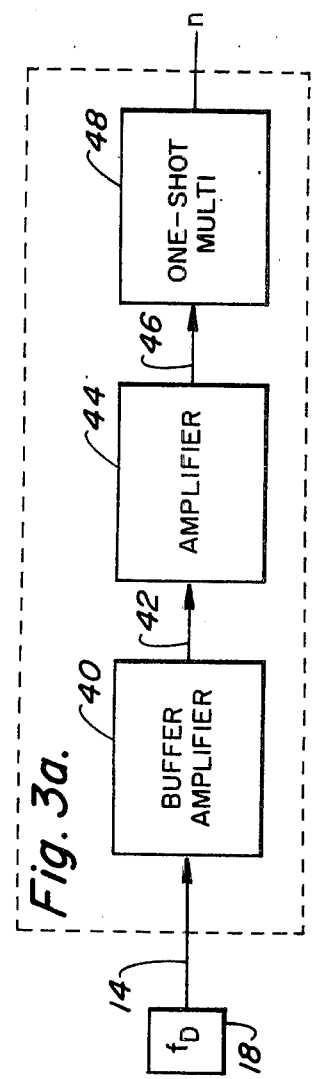

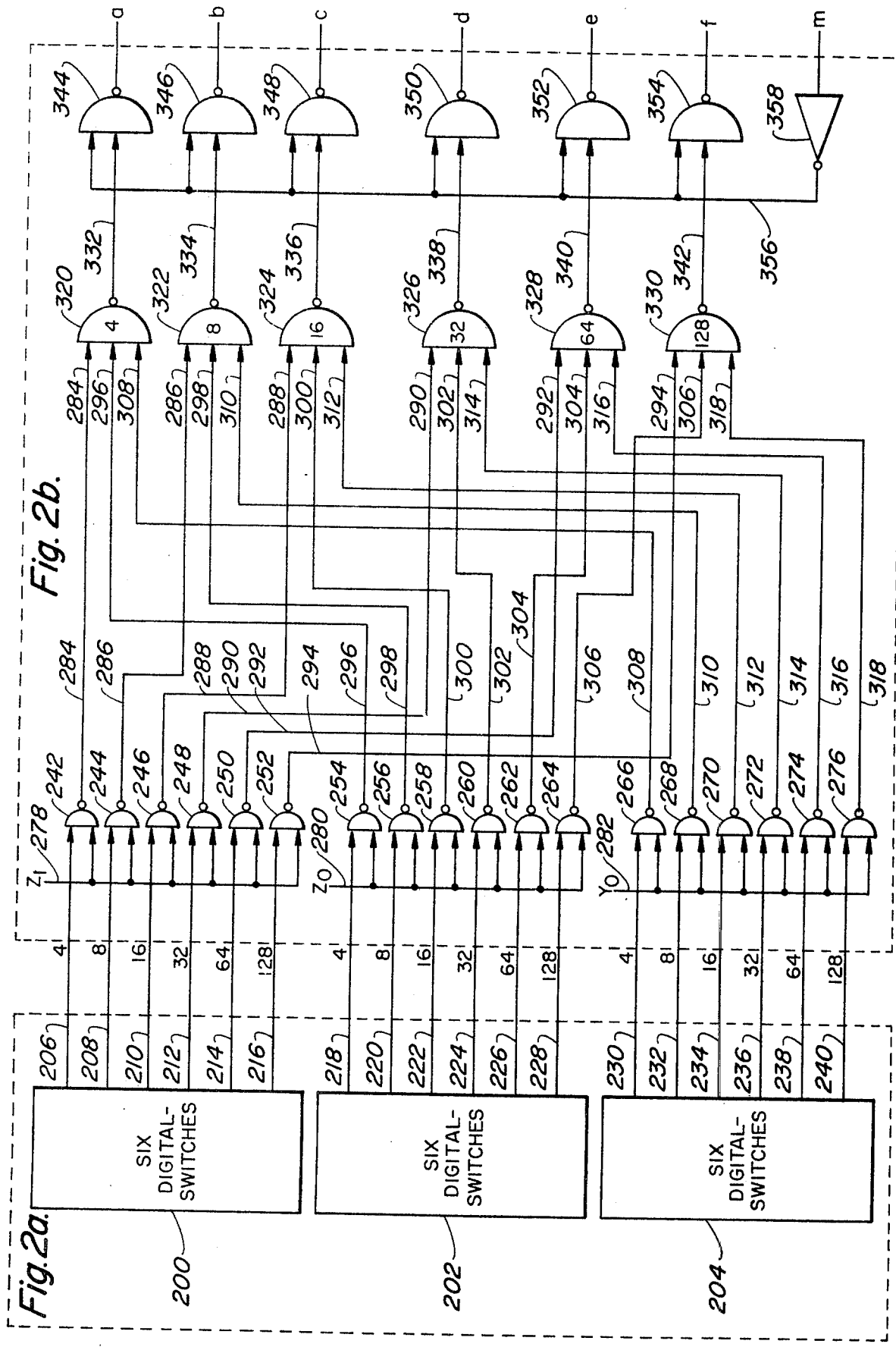

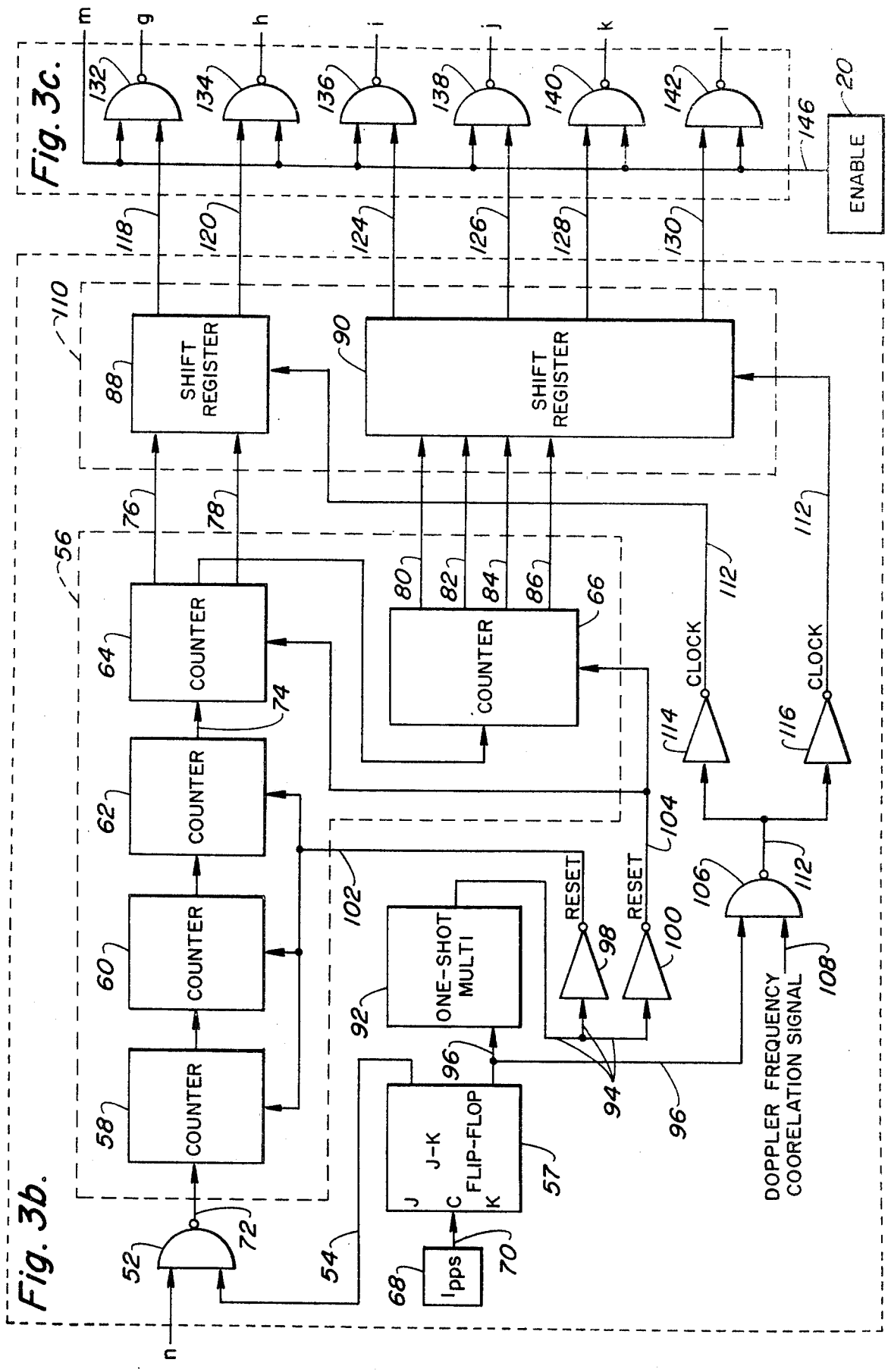

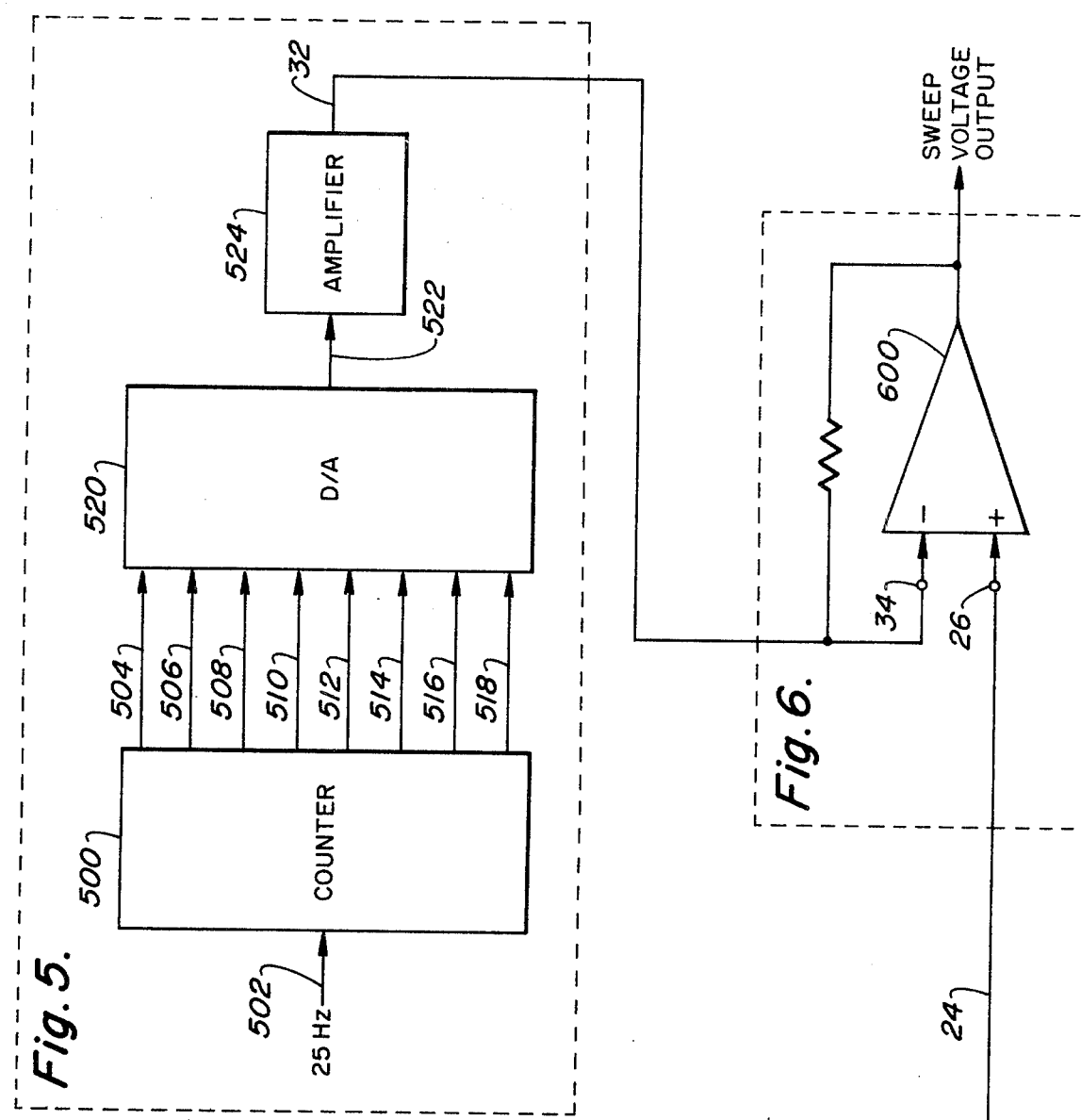
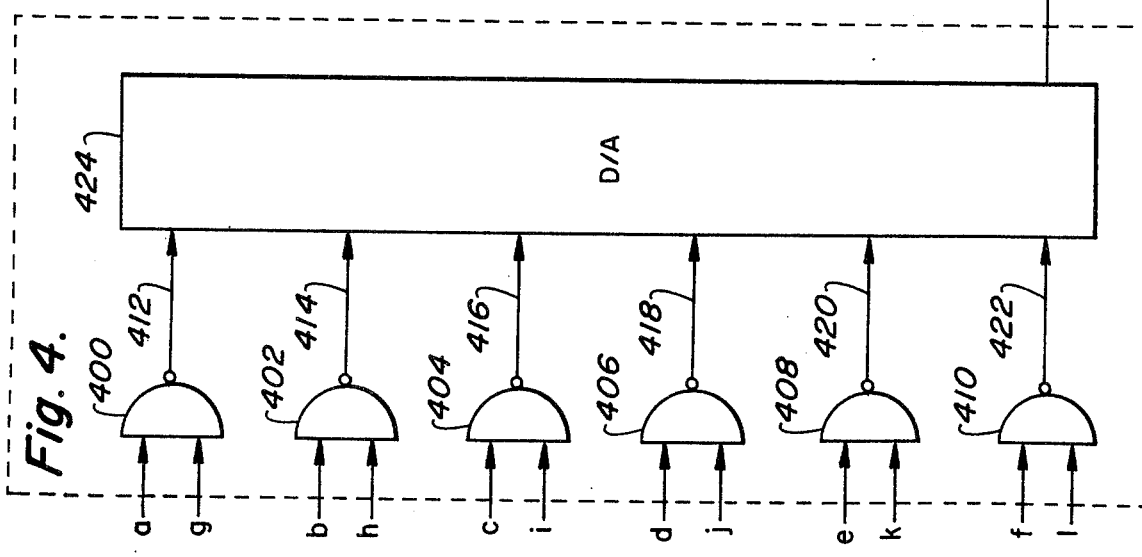

CIRCUIT FOR GENERATING A DIGITAL OR ANALOG SIGNAL AS A FUNCTION OF DOPPLER FREQUENCY

This is a division of application Ser. No. 436,415 filed Jan. 25, 1974, now U.S. Pat. No. 3,893,115.

BACKGROUND OF THE INVENTION

1. Field of the Invention

The present invention relates generally to control circuits for providing sweep voltages to receivers in a doppler satellite tracking station and, more particularly, to such control circuits having a digital memory therein.

2. Description of the Prior Art

Prior art control circuits having memories for providing sweep voltages to receivers in doppler satellite tracking stations utilize magnetic amplifiers and related RC circuitry. Such circuits are expensive, complex, bulky and heavy. Such circuits age, causing component parameters to degrade making repair or replacement necessary. Also, numerous direct current voltage levels must be generated thereby adding weight, size and expense to the control circuit. In addition, since such circuits depend on RC circuitry to generate the sweep voltages, their speed is limited by their capacitor charging/discharging time. Also, due to the above limitations, such prior art devices lack sufficient accuracy to ensure optimum operation of the doppler satellite tracking station.

SUMMARY OF THE INVENTION

The general purpose of the present invention is to provide a control circuit having a digital memory for generating sweep voltages for receivers in a doppler satellite tracking station that is smaller, less expensive, less complex, lighter in weight, has fewer direct-current voltage sources, and is not as susceptible to repair or replacement as prior art control circuits. To attain this, the present invention provides an internally generated ramp voltage which is combined with a reference voltage to produce a composite sweep signal for the receiver. The reference voltage is a function of a manually-set digital signal or a digital signal that is a function of the frequency of a received doppler signal. The digital signal is converted to an analog level before being combined with the ramp voltage. The circuit generating the digital signal that is a function of the frequency of a received doppler signal includes a digital memory circuit which remembers the digital signal whenever the signal being received is lost, thereby ensuring that the receiver searches in the correct doppler frequency range at the proper rate.

Accordingly, one object of the present invention is to reduce cost.

Another object of the present invention is to simpliffy design.

Another object of the present invention is to reduce size.

Another object of the present invention is to reduce weight.

Another object of the present invention is to reduce the number of direct-current voltage sources.

Another object of the present invention is to reduce D.C. voltage levels.

Another object of the present invention is to reduce susceptibility to repair and replacement.

Another object of the present invention is to provide a voltage sweep generator wherein drift is eliminated and a high order of memory is realized.

Another object of the present invention is to increase the accuracy of the generated sweep voltages.

Other objects and a more complete appreciation of the present invention and its many attendant advantages will develop as the same becomes better understood by reference to the following detailed description when considered in connection with the accompanying drawings in which like reference numerals designate like parts throughout the figures thereof and wherein:

BRIEF DESCRIPTION OF THE DRAWINGS

FIG. 1 is a block diagram of a specific embodiment illustrating the interconnection of the control circuit having a memory for providing sweep voltage to a receiver in a doppler satellite tracking station.

FIGS. 2a and 2b are detailed schematic diagrams of the individual manually-set digital signal generator circuit of FIG. 1.

FIGS. 3a through 3c are detailed schematic diagrams of the individual circuit for generating a digital signal that is a function of the frequency of a received doppler signal of FIG. 1.

FIG. 4 is a detailed schematic diagram of the individual digital-to-analog converter circuit of FIG. 1.

FIG. 5 is a detailed block diagram of the individual ramp function generator of FIG. 1.

FIG. 6 is a detailed schematic diagram of the voltage combiner circuit of FIG. 1.

DETAILED DESCRIPTION OF THE PREFERRED EMBODIMENT

Referring to FIG. 1, numeral 10 designates the enable signal input to a circuit for generating a digital signal that is a function of the frequency of a received doppler signal 12. Also, inputing circuit 12 on line 14 is a received doppler signal 18. It will be appreciated by those skilled in the art that there is both a highfrequency received doppler signal and a low-frequency received doppler signal in a doppler satellite tracking station. In a doppler satellite tracking station, there are two circuits identical to the specific embodiment of FIG. 1, except for some insignificant differences - one for the high-frequency received doppler signal and one for the low-frequency received doppler signal. FIG. 1 illustrates a circuit for processing only one of the received doppler signals.

Circuit 12 generates a six-bit digital signal on lines $g$ through $l$ whenever an enable signal 20 on line 10 is at a logic 1 level. The six-bit digital signal on lines $g$ through $l$ is a function of the frequency of received doppler signal 18 on line 14. Whenever enable signal 20 on line 10 is at a logic 0 level, there is no output on lines $g$ through $l$.

Enable signal 20 on line 10 is outputed on line $m$, which inputs manually-set digital-signal generator circuit 16. If enable signal 20 on line $m$ is at a logic 0 level, circuit 16 generates a six-bit digital signal on lines $a$ through $f$. The six-bit digital signal on lines $a$ through $f$ is manually set. Whenever enable signal 20 on line $m$ is at a logic 1 level, there is no output on lines $a$ through $f$. In summary, either circuit 12 or circuit 16 generates a six-bit digital signal, depending on the logic level of enable signal 20.

The digital signals generates by circuit 12 or circuit 16 input digital-to-analog converter circuit 22 on lines

*a* through *f* or on lines *g* through *l*. Digital-to-analog converter circuit 22 outputs an analog signal on line 24.

Ramp function generator 30 generates a ramp function signal on line 32.

The ramp function signal on line 32 inputs voltage-combiner circuit 28 at negative terminal 34. The analog signal on line 24 inputs voltage-combiner circuit 28 at positive terminal 26. Voltage-combiner circuit 28 subtracts the ramp function signal on line 32 from the analog signal on line 24. The signal resulting from the subtraction is the sweep voltage output appearing on line 38. The sweep voltage output on line 38 inputs a receiver (not shown) of a doppler satellite tracking station (not shown).

FIG. 3a illustrates a means for providing a doppler frequency signal. Received doppler signal 18 on line 14 inputs buffer amplifier 40. Buffer amplifier 40 outputs received doppler signal 18 on line 42, which inputs amplifier 44. Amplifier 44 outputs received doppler signal 18 on line 46, which inputs one-shot multi 48. Amplifier 44 is an inverting amplifier having an adjustable gain. One-shot multi 48 outputs on line *n* a train of pulses of identical frequency to received doppler signal 18.

FIG. 3b illustrates a means for generating a digital signal that is a function of the frequency of received doppler signal 18. The pulse train on line *n* inputs a gate 52. A logic 1 level on line 54 from J-K flip-flop 57 enables gate 52, allowing the pulse train on line *n* to input counter circuit 56 comprised of multi-bit counters 58, 60, 62, 64 and 66. A one-pulse-per-second signal 68 inputs J-K flip-flop 57 on line 70. Signal 68 causes the signal on line 54 to repetitively enable gate 52 for one second, and then disable gate 52 for one second. One-pulse-per-second signal 68 is used so counter circuit 56 will output directly in cycles per second.

The pulse train on line n inputs counter 56 on line 72. Counters 58, 60, and 62 comprise a ten-bit binary counter, which produces an output on line 74 for every 1,024 input pulses on line 72 counted. Counters 64 and 66 comprise a six-bit binary counter which can count 64 pulses on line 74 before reaching its capacity.

The two outputs of counter 64 input storage register 88 via lines 76 and 78. The four outputs of counter 66 input storage register 90 via lines 80, 82, 84 and 86. The weights assigned to the outputs on lines 76, 78, 80, 82, 84 and 86 are 1,024, 2,048, 4,096, 8,192, 16,384 and 32,768, respectively. For example, if the counter 56 counted 24,632 cycles in one particular second, the outputs on lines 76, 78, 80, 82, 84 and 86 would be 000110, respectively.

J-K flip-flop 57 and one-shot multi 92 comprise a circuit which generates a reset signal on line 94 for counters 58, 60, 62, 64 and 66, and a clock signal on line 96 for shift registers 88 and 90. One-shot multi 92 is triggered when the signal on line 96 from J-K flip-flop 57 goes to a logical 0, i.e., on the negative going excursion of the signal on line 96. When triggered, one-shot multi 92 outputs on line 94 a negative pulse, which after being inverted by inverters 98 and 100, inputs counters 58, 60, and 62 via line 102 and counters 64 and 66 via line 104. The counter 56, after being reset, counts for one second, maintains this count for one second and is then reset immediately prior to the next counting cycle.

At the termination of the count (end of the counting second), the information, a binary word, present in counter 56, is shifted into storage register 88 and 90. This shift is made on the positive transition of the signal on line 96, exactly one second after the reset pulse on line 94 to counter 56 has been generated. The clock signal on line 96 passes through gate 106, which is enabled by a logic 1 on line 108. A logic 1 on line 108 indicates that the two doppler frequencies being received by the receiver are coherent. When a logic 0 is present on line 108, the clock pulse on line 96 is inhibited from passiing through gate 106. This prevents shift register 88 and 90 from shifting, thereby retaining their contents. Thus, when the signal is lost by the radar system, i.e., two doppler signals being received are not coherent, memory circuit 110, comprised of shift registers 88 and 90, remembers the last received binary word until the receiver relocates the signal. Thus, memory circuit 110 ensures that the doppler radar system searches in the correct doppler frequency range until the signal can be relocated. The signal on line 96 passes through gate 106 and is transmitted to shift registers 88 and 90 via line 112 after being inverted by inverters 114 and 116.

To summarize the sequence of events: (a) the one-pulse-per-second signal 68 toggles J-K flip-flop 57 to the logical 1 state, i.e., the signal on line 54 assumes a logic 1 state; this transition triggers one-shot multi 92, generating a reset pulse on line 94 and also enables gate 52, thus allowing reshaped received doppler signal 18 to pass on to counter 56; (b) next, one-pulse-per-second signal 68 toggles J-K flip-flop to the logical 0 state; this transition inhibits gate 52 and clocks the binary word from counters 64 and 66 into storage registers 88 and 90; (c) the sequence is then repeated.

FIG. 3c illustrates a means for gating the binary digital signal in shift registers 88 and 90 to the digital-to-analog converter circuit of FIG. 4. Shift register 88 outputs binary bits on lines 118 and 120 corresponding to the binary bits inputing shift register 88 on lines 76 and 78, respectively. Shift register 90 outputs binary bits on lines 124, 126, 128, and 130 corresponding to the binary bits inputing shift register 90 on lines 80, 82, 84, and 86, respectively. The binary bits from shift registers 88 and 90 on lines 118, 120, 124, 126, 128, and 130 input gates 132, 134, 136, 138, 140 and 142, respectively. Enable signal 20 inputs gates 132, 134, 136, 138 and 140 on line 146. When enable signal 20 is at a logical 1 level, gates 132, 134, 136, 138, 140 and 142 are enabled and the binary bits on lines 118, 120, 124, 126, 128 and 130 pass through gates 132, 134, 136, 138, 140 and 142, respectively, and are transmitted to the digital-to-analog converter circuit of FIG. 4 via lines *g, h, i, j, k,* and *l*. When enable signal 20 is at a logic "0" level, gates 132, 134, 136, 138, 140 and 142 are inhibited, thereby preventing the binary digital signal on lines 118, 120, 124, 126, 128 and 130 from passing through to the digital-to-analog converter of FIG. 4.

FIG. 2a illustrates a means for providing a manually-set digital signal. Each block 200, 202, and 204 represent six digi-switches. The digi-switches are manually-set to create a binary digital signal having six bits. Digi-switch 200 has six outputs on line 206, 208, 210, 212, 214 and 216 weighted 4, 8, 16, 32, 64 and 128, respectively. Digi-switch 202 has six outputs on lines 218, 220, 222, 224, 226, and 228 weighted 4, 8, 16, 32, 64 and 128, respectively. Digi-switch 204 has six outputs on lines 230, 232, 234, 236, 238, and 240 weighted 4, 8, 16, 32, 64 and 128 respectively.

FIG. 2b illustrates a means for gating a manually-set binary digital signal to the digital-to-analog converter circuit of FIG. 4. Each set of digi-switches 200, 202, and 204 generate a binary digital signal, only one of which is gated to the digital-to-analog converter circuit of FIG. 4. The outputs of digi-switches 200 on lines 206, 208, 210, 212, 214 and 216 input gates 242, 244, 246, 248, 250, and 252, respectively. The outputs of digi-switches 202 on lines 218, 220, 222, 224, 226 and 228 input gates 254, 256, 258, 260, 262 and 264, respectively. The outputs of digi-switches 204 on lines 230, 232, 234, 236, 238 and 240 input gates 266, 268, 270, 272, 274 and 276, respectively. Also inputing the three sets of gates are enable signals $Z_1$, which inputs gates 242, 244, 246, 248, 250 and 252 on line 278, $Z_O$, which inputs gates 254, 256, 258, 260, 262 and 264 on line 280, and $Y_O$, which inputs gates 266, 268, 270, 272, 274, and 276 on line 282. Of enable signals $Z_l$, $Z_O$, and $Y_O$, only one is at a logic 1 level at a particular time. Thus, only one binary digital signal is gated to the digital-to-analog converter circuit of FIG. 4 at a specific time. For example, when $Z_1$ is at a logic 1 level, both $Z_O$ and $Y_O$ are at logic 0 levels. Thus, gates 242, 244, 246, 248, 250 and 252 are enabled, allowing the output of digi-switches 200 to pass through while gates 254, 256, 258, 260, 262, 264, 266, 268, 270, 272, 274 and 276 are inhibited, thereby preventing the outputs of digi-switches 202 and 204 from passing through.

Gates 242, 244, 246, 248, 250, 252, 254, 256, 258, 260, 262, 265, 266, 268, 270, 272, 274 and 276 have outputs on lines 284, 286, 288, 290, 292, 294, 296, 298, 300, 302, 304, 306, 308, 310, 312, 314, 316, and 318, respectively.

Lines 284, 296 and 308 input gate 320. Lines 286, 298 and 310 input gate 322. Lines 288, 300, and 312 input gate 324. Lines 290, 302 and 314 input gate 326. Lines 292, 304, and 316 input gate 328. Lines 294, 306, and 318 input gate 330. The inputs to gate 320 are all 4 weight binary bits. The inputs to gate 322 are all 8 weight binary bits. The inputs to gate 324 are all 16 weight binary bits. The inputs to gate 326 are all 32 weight binary bits. The inputs to gate 328 are all 64 weight binary bits. The inputs to gate 330 are all 128 weight binary bits. Gates 320, 322, 324, 326, 328, and 330 output on lines 332, 334, 336, 338, 340 and 342, respectively.

Lines 332, 334, 336, 338, 340 and 342 input gates 344, 346, 348, 350, 352, and 354, respectively. Enable signal 20 from FIG. 3c on line m also inputs gates 344, 346, 348, 350, 352 and 354 on line 356 after being inverted by inverter 358. Whenever enable signal 20 assumes a logic 1 level, gates 132, 134, 136, 138, 140, and 142 are enabled, allowing the binary digital signal from shift registers 88 and 90 to pass through to lines g, h, i, j, k, and l. But inverter 358 causes enable signal 20 to assume a logic 0 level on line 356, thereby inhibiting gates 344, 346, 348, 350, 352, and 354. Of course, when enable signal 20 is a logic 0 on line 146, gates 132, 134, 136, 138, 140 and 142 are inhibited and gates 344, 346, 348, 350, 352 and 354 are enabled, allowing the binary digital signal on lines 332, 334, 336, 338, 340 and 342 to pass through the gates, thereby appearing on lines a through f, respectively.

FIG. 4 illustrates a digital-to-analog converter circuit. Lines a and g input gate 400. Lines b and h input gate 402. Lines c and i input gate 404. Lines d and j input gate 406. Lines e and k input gate 408. Lines f and l input gate 410. Gates 400, 402, 404, 406, 408 and 410 comprise an input circuit to digital-to-analog converter 424. The outputs of gates 400, 402, 404, 406, 408 and 410 input digital-to-analog converter 424. The outputs of gates 400, 402, 404, 406, 408 and 410 input digital-to-analog converter 424 via lines 412, 414, 416, 418, 420 and 422, respectively. Digital-to-analog converter 424 converts the parallel binary digital word appearing on lines 412, 414, 416, 418, 420 and 422 to an analog level which appears on line 24.

FIG. 5 illustrates a means for generating a continuous train of identical ramp function signals. A constant-frequency signal (25 Hz) inputs eight-bit binary counter 500 via line 502. The capacity of counter 500 is $2^8 = 256$. With a 25 Hz input, it will recycle every $256/25 \simeq 10.2$ seconds, achieving every count between 00000000 and 11111111 in this time. Counter 500 outputs an eight-bit digital number on lines 504, 506, 508, 510, 512, 514, 516 and 518, each of which input digital-to-analog converter 520. The output of digital-to-analog converter 520 on line 522 is a ramp or sawtooth voltage having a period of 10.2 seconds. This ramp voltage inputs amplifier 524 via line 522. Amplifier 524 outputs a ramp voltage on line 32.

FIG. 6 illustrates a voltage combiner circuit. Operational amplifier 600 has a negative input 34 and a positive input 26. The analog reference signal on line 24 inputs operational amplifier 600 at positive input terminal 26. The ramp signal on line 32 inputs operational amplifier 600 at negative input terminal 34. The two received signals on lines 24 and 32 are combined, thus providing a sweep voltage output on line 38 to a voltage-controlled oscillator of a receiver of the doppler satellite tracking station of proper amplitude and duration to ensure searching in the correct doppler frequency range.

It will be appreciated by those skilled in the art that the complete circuit diagram of FIGS. 2 through 6 includes such suitable and necessary biasing voltage sources and interconnections as are usually provided in the circuits of FIGS. 2 through 6.

It is noted that the particular frequencies of the signals utilized and the particular weights assigned particular bits in the specific embodiment disclosed in FIGS. 2 through 6 were chosen to comport with the parameter of a specific radar system. Those having skill in the art will readily recognize that other values could be utilized, depending upon the particular radar system utilized.

Obviously many modifications and variations of the present invention are possible in light of the above teachings. It is therefore to be understood that within the scope of the appended claims the invention may be practiced otherwise than as specifically described.

I claim:
1. A circuit for generating an analog voltage that is a function of the frequency of a received doppler signal in a doppler satellite tracking station comprising:
   a. a multiple-bit counter circuit having a first and a second input and a plurality of outputs;
   b. means for providing a doppler frequency signal having an output;
   c. a first gate circuit having an output and a first and a second input, said output being connected to said first input of said counter circuit, said first input of said gate circuit being connected to said output of said means for providing a doppler frequency signal;

d. a storage register having a plurality of inputs connected to said plurality of outputs of said counter circuit such that said counter circuit and said storage register are in parallel, said storage register having a plurality of outputs, said plurality of outputs being a binary digital signal that is a function of the frequency of said doppler-frequency signal, said storage register also having a clock input;

e. a digital-to-analog converter circuit having an input circuit and an output, said output being said analog voltage;

f. means for providing an enable signal;

g. means for gating in parallel said binary digital signal from said plurality of outputs of said storage register to said input circuit of said digital-to-analog converter input circuit whenever said enable signal is present, said enable signal being connected to said means for gating;

h. means for providing a low-frequency signal having an output;

i. means for providing a doppler-frequency correlation signal having an output;

j. a circuit for generating control signals having a low-frequency signal input, a doppler-frequency correlation input, a gate signal output, a reset signal output, and a clock signal output, said low-frequency input being connected to said output of said means for providing a low-frequency signal, said doppler-frequency correlation input being connected to said output of said means for providing a doppler-frequency correlation signal, said gate signal output being connected to said second input of said gate circuit whereby said gate circuit is enabled when a control signal is at a logic 1 level on said gate signal output, said reset signal output being connected to said second input to said counter circuit whereby said counter circuit is reset when a control signal is present on said reset signal output, said clock signal output being connected to said clock input of said storage register wherein said storage register shifts the contents of said counter circuit into itself only when a control signal is present on said clock signal output, thereby said storage register remembers said digital signal that is a function of the frequency of said doppler-frequency signal until a control signal is present on said clock signal output.

2. The generator of claim 1 wherein said circuit for generating control signals comprises:

a. a flip-flop having an input and a first and a second output, said input being connected to said output of said means for providing a low-frequency signal, said first output being said gate signal output;

b. a monostable multivibrator having an input and an output, said input being connected to said second output of said flip-flop, said output being said reset signal output;

c. a second gate circuit having a first and a second input and an output, said first input being connected to said second output of said flip-flop, said second input being connected to said output of said means for providing a doppler frequency correlation signal, said output being said clock signal output.

3. The generator of claim 2 wherein said plurality of outputs of said multiple-bit counter are fewer in number than the number of bits of said multiple-bit counter.

4. A circuit for generating a binary digital signal that is a function of the frequency of a received doppler signal in a doppler satellite tracking station comprising:

a. a multiple-bit counter circuit having a first and a second input and a plurality of outputs;

b. means for providing a doppler frequency signal having an output;

c. a first gate circuit having an output and a first and a second input, said output being connected to said first input of said counter circuit, said first input of said gate circuit being connected to said output of said means for providing a doppler frequency signal;

d. a storage register having a plurality of inputs connected to said plurality of outputs of said counter circuit such that said counter circuit and said storage register are in parallel, said storage register having a plurality of outputs, said plurality of outputs being said binary digital signal that is a function of the frequency of said doppler frequency signal, said storage register also having a clock input;

e. means for providing a low-frequency signal having an output;

f. means for providing a doppler-frequency correlation signal having an output;

g. a circuit for generating control signals having a low-frequency signal input, a doppler frequency correlation input, a gate signal output, a reset signal output and a clock signal output, said low-frequency input being connected to said output of said means for providing a low-frequency signal, said doppler frequency correlation input being connected to said output of said means for providing a doppler frequency correlation signal, said gate signal output being connected to said second input of said gate circuit whereby said gate circuit is enabled when a control signal is at a logic 1 level on said gate signal output, said reset signal output being connected to said second input to said counter circuit whereby said counter circuit is reset when a control signal is present on said reset signal output, said clock signal output being connected to said clock input of said storage register wherein said storage register shifts the contents of said counter circuit into itself only when a control signal is present on said clock signal output, thereby said storage register remembers said digital signal that is a function of the frequency of said doppler-frequency signal until a control signal is present on said clock signal output.

5. The generator of claim 4 wherein said circuit for generating control signals comprises:

a. a flip-flop having an input and a first and a second output, said input being connected to said output of said means for providing a low-frequency signal, said first output being said gate signal output;

b. a monostable multivibrator having an input and an output, said input being connected to said second output of said flip-flop, said output being said reset signal output;

c. a second gate circuit having a first and a second input and an output, said first input being connected to said second output of said flip-flop, said second input being connected to said output of said means for providing a doppler-frequency correlation signal, said output being said clock signal output.

6. The generator of claim 5 wherein said plurality of outputs of said multiple-bit counter are fewer in number than the number of bits of said multiple-bit counter.

* * * * *